(12) United States Patent
Parkinson

(10) Patent No.: US 8,194,433 B2
(45) Date of Patent: Jun. 5, 2012

(54) METHOD AND APPARATUS FOR ACCESSING A BIDIRECTIONAL MEMORY

(75) Inventor: Ward Parkinson, Boise, ID (US)

(73) Assignee: Ovonyx, Inc., Sterling Heights, MI (US)

( * ) Notice: Subject to any disclaimer, the term of this patent is extended or adjusted under 35 U.S.C. 154(b) by 0 days.

(21) Appl. No.: 12/070,682

(22) Filed: Feb. 20, 2008

(65) Prior Publication Data

US 2009/0207645 A1     Aug. 20, 2009

(51) Int. Cl.
*G11C 11/00* (2006.01)

(52) U.S. Cl. .......................................... 365/148; 365/158

(58) Field of Classification Search .................... 365/148
See application file for complete search history.

(56) References Cited

U.S. PATENT DOCUMENTS

| | | | |
|---|---|---|---|
| 2006/0256613 A1* | 11/2006 | Dodge et al. | 365/163 |
| 2007/0045704 A1* | 3/2007 | Ufert | 257/314 |
| 2007/0211514 A1* | 9/2007 | Liaw et al. | 365/148 |
| 2008/0165598 A1* | 7/2008 | Park et al. | 365/189.18 |
| 2008/0175036 A1* | 7/2008 | Oh et al. | 365/148 |
| 2008/0298121 A1* | 12/2008 | Otterstedt et al. | 365/163 |
| 2009/0027951 A1* | 1/2009 | Kau | 365/163 |

* cited by examiner

*Primary Examiner* — Hoai V Ho
*Assistant Examiner* — Anthan Tran
(74) *Attorney, Agent, or Firm* — Kevin L. Bray

(57) ABSTRACT

A bidirectional memory cell includes an ovonic threshold switch (OTS) and a bidirectional memory element. The OTS is configured to select the bidirectional memory element and to prevent inadvertent accesses to the memory element.

18 Claims, 8 Drawing Sheets

METHOD AND APPARATUS FOR ACCESSING A BIDIRECTIONAL MEMORY

CROSS-REFERENCE TO RELATED APPLICATIONS

FIELD OF INVENTION

This invention relates to accessing bidirectional memory devices.

BACKGROUND OF THE INVENTION

As electronic memories approach limits beyond which they will no longer be able to produce the density/cost/performance improvements so famously set forth in Moore's law, a host of memory technologies are being investigated as potential replacements for conventional silicon complementary metal oxide semiconductor (CMOS) integrated circuit memories.

Among the memory technologies being investigated are a number of bidirectional memory technologies: memories that exploit a directional characteristic of the material used to program or read a memory device. That is, conventional memory devices typically associate one of two memory states with the presence or absence of charge, or with a high or low voltage, for example. In conventional memories such as this, memory states are associated with uni-directional characteristics; charge is either present or not (e.g., DRAM, FLASH) or a node is held at a high or low voltage (e.g., SRAM). There is no sense of "direction" to such storage mechanisms. In contrast, bidirectional memories employ some directional aspect of their memory material to store binary information. For example, one memory state may be written by forcing a current through a bidirectional memory device in one direction or applying a voltage of one polarity, and another memory state may be written by forcing a current through the same device in the opposite direction or applying a voltage of the opposite polarity. The programmed memory states may then be sensed by, for example, applying to the memory device either a voltage to measure current related to memory state, or forcing a current through and measuring a voltage related to memory state.

Bidirectional memory types include resistive random access memories and magneto-resistive random access memories (both referred to as RRAM), programmable metallization cells, Pnictide phase change memories, polymer memories, ferro-electric random access memories (FeRAM), ionic memory devices and metal nano-particle memory cells.

An RRAM cell may be programmed, respectively, to high resistance and low resistance values by applying electric pulses of opposite polarities to a cell. The cell's high and low resistance values are employed to represent two different memory states. RRAM memories are known and described, for example, in a paper by W. W. Zhuang et al, presented at the 2002 International Electron Device Meeting (IEDM), entitled, "Novell Colossal Magnetoresistive Thin Film Nonvolatile Resistance Random Access Memory (RRAM)," which is hereby incorporated by reference.

Programmable metallization cells utilize electrochemical control of nanoscale quantities of metal in thin films of solid electrolyte. Information is stored via electrical changes caused by the oxidation of a metal and reduction of metal ions in the solid electrolyte. Such an electrical change may be induced by applying a small electrical bias to a cell. A reverse bias will reverse the oxidation until the electrodeposited or electro-plated metal has been removed, thereby returning the cell to the original memory state. Programmable metallization cells are known and discussed, for example, in a paper entitled "Non-Volatile Memory Based on Solid Electrolytes," by Michael N. Kozicki, et al, in an article entitled "Bipolar and Unipolar Resistive Switching in Cu-Doped $SiO_2$,", and by Christina Schindler et al. in *IEEE Transactions on Electron Devices* 54: 2762-2768, and in "Programmable Metallization Cell Memory Based on Ag—Ge—S and Cu—Ge—S Solid Electrolytes" by Michael N. Kozicki et al, available from the Institute of Electrical and Electronics Engineers, which papers are hereby incorporated by reference.

Polymer memories exhibit electrical bistability involving an increase in conductivity when a bias voltage of sufficient magnitude is applied to a cell. The cell may be returned to a low conductivity state by applying a bias voltage of the opposite. polarity to the device. Polymer memories are known and described, for example, in "Polymer Memory Device Based on Conjugated Polymer and Gold Nanoparticles," by Ankita Prakash et al, published by the American Institute of Physics in 2006, which is hereby incorporated by reference.

Ferroelectric random access memories (FeRAMs) employ ferroelectric capacitors to store data. A voltage pulse of one polarity is used to program a cell to one memory state and a voltage pulse of opposite polarity may be employed to program the cell to another memory state. FeRAMs are known and described in "A Survey of Circuit Innovations in Ferroelectric Random-Access Memories," by Ali Sheikholeslami et al, published in The Proceedings of the IEEE, Vol. 88, No. 5, May 2000, which is hereby incorporated by reference.

Bidirectional memory cells may be arranged in rectangular arrays in which individual memory cells are located at the intersection of row and column address lines, where one line is placed above the other. Individual cells are accessed (that is, read from or written to) by asserting the row address line and column address line that uniquely define a cell's location within the array. Or, for greater bandwidth, more than one column may be selected in parallel onto one row line, where each column line has separate read and write circuitry. Although an individual cell may be uniquely addressed by assertion of a row and column address line pair, because a plurality of memory cells share a row address line and a plurality of cells share a column address line (cells do not share row and column address lines), a plurality of cells may be "partially" selected by the assertion of a row or column address line.

That is, if, for example, a memory cell is selected by raising the voltage of its column address line and lowering the voltage of its row address line, all cells that share the selected column address line will have the voltage of their column address line raised and all cells that share the selected row address line will have the voltage of their row address line lowered and, in that sense, these non-selected cells will be partially selected.

Such partial selection poses the risk of inadvertently accessing one or more memory cells in addition to the targeted memory cell. Such inadvertent access could jeopardize the validity of the memory's data through an illegitimate read or write operation, sometimes characterized as a mis-read or mis-write. Current leakage paths may exacerbate the risk of inadvertent accesses. Such partial selection, leakage paths, and the attendant risks of inadvertent cell access, may be substantially eliminated, for example, by employing a pair of transistors at each cell location to uniquely access each memory cell. However, the addition of such selection transistors at each memory cell imposes a significant penalty in the form of increased memory cell area. A method and apparatus that provides bi-directional write access to a uniquely select a memory cell in an array that also prevents inadvertent access of bidirectional memory cells without significantly increasing the area of such a memory cell would therefore be highly desirable.

SUMMARY OF THE INVENTION

A bidirectional memory cell in accordance with the principles of the present invention includes a bidirectional threshold device, such as an ovonic threshold switch (OTS), and a bidirectional memory element. The bidirectional threshold device in series with the memory element isolates the bidirectional memory element from surrounding circuitry and to thereby prevent inadvertent accesses to the memory element, for read or write. More than one OTS may be inserted in series with the memory element to achieve either larger isolation voltage or reduced snap-back, such as by using a lower voltage that is close to the Vh, and achieving an adequate total voltage by using more than one in series.

Bidirectional memory elements include memory elements that exploit a directional characteristic of the material used to form a memory device. For example, one memory state may be written by forcing a current through a bidirectional memory cell in one direction and another memory state may be written by forcing a current through the same cell in the opposite direction. Alternatively, a voltage of one polarity may be applied to a memory cell to program the cell to one memory state, and another memory state may be programmed by applying a voltage of the opposite polarity to the same cell, for example. The programmed memory states may then be sensed by applying a voltage and sensing current or forcing a current through the cell and measuring voltage, for example. In accordance with the principles of the present invention, a bidirectional threshold device, such as an OTS, provides circuit isolation within bidirectional memory cells, thereby preventing inadvertent access of bidirectional memory devices.

In accordance with the principles of the present invention, bidirectional memory cells that include a bidirectional memory and an OTS may be arranged in rectangular arrays in which individual memory cells are located at the intersection of row and column address lines. Individual cells are accessed (that is, read from or written to) by asserting the row address line and column address line that uniquely define a cell's location within the array. Such an array may include bipolar (applied in forward and reverse direction) current and/or voltage sources configured to apply the currents and/or voltages necessary to program the bidirectional cells to the different memory states. A bidirectional memory array in accordance with the principles of the present invention may also include a bidirectional switch which enables the application of access voltages and/or currents of either polarity to cells within the memory array. In accordance with the principles of the present invention, a bidirectional threshold device such as an OTS may be inserted in series with each bidirectional memory cell. The bidirectional threshold devices (OTS) may be so situated, and bias voltages arranged in magnitude and sequence, to ensure that no inadvertent access to an unselected memory cell is allowed.

Bidirectional memories in accordance with the principles of the present invention may be particularly suitable for operation in a variety of electronic devices, including cellular telephones, radio frequency identification devices (RFID), computers (portable and otherwise), location devices (e.g., global positioning system (GPS) devices, particularly those that store and update location-specific information), and handheld electronic devices, including personal digital assistants (PDAs), and entertainment devices, such as MP3 players, for example.

DETAILED DESCRIPTION

Figure 1:
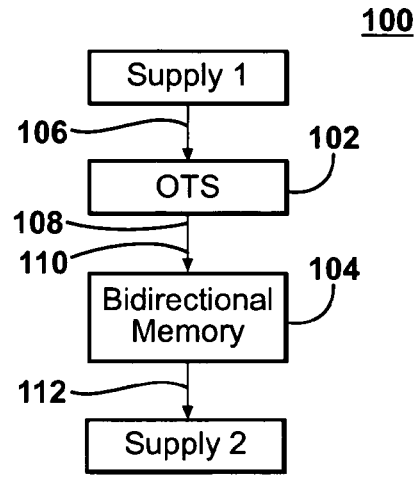
FIG. 1 is a conceptual block diagram of a bidirectional memory cell in accordance with the principles of the present invention.

Although this invention will be described in terms of certain preferred embodiments, other embodiments that are apparent to those of ordinary skill in the art, including embodiments that do not provide all of the benefits and features set forth herein, are also within the scope of this invention. Various structural, logical, process step, chemical, and electrical changes may be made without departing from the spirit or scope of the invention. Polarities and types of devices and supplies may be substituted in a manner that would be apparent to one of reasonable skill in the art. For example, a field effect transistor (FET) may be substituted for a bipolar junction transistor (BJT), an n-channel device may be substituted for a p-channel device, an npn device may be substituted for a pnp device, all with appropriate adjustment of supply voltages and biasing, for example. Although the description of illustrative embodiments herein will be given in terms of OTSs, other electronic bidirectional threshold devices are contemplated by and fall within the scope of the present invention.

Example illustrative embodiments in the following detailed description may focus, for clarity of description and succinctness, on bidirectional memories that exhibit resistance changes in response to the application of signals of opposite polarity, but methods and apparatuses in accordance with the principles of the present invention may be applied to unidirectional or bidirectional memories that employ other properties to distinguish among memory states. Accordingly, the scope of the invention is defined only by reference to the appended claims.

One bidirectional memory cell selection device, the Ovonic Threshold Switch (OTS), is well-suited for application as the bidirectional threshold device in unidirectional or bidirectional memory cells in accordance with the principles of the present invention. OTS devices capitalize on the characteristics of chalcogenide materials to provide switching of electrical signals. Early work in chalcogenide devices demonstrated electrical switching behavior in which switching from an "off" resistive state to an "on" conductive state was induced upon application of a voltage at or above the threshold voltage of the active chalcogenide material, or application of a current at or above the threshold current of the active chalcogenide material. This effect is the basis of the OTS and remains an important practical feature of chalcogenide materials. The OTS provides reproducible switching at fast switching speeds. Basic principles and operational features of the OTS are presented, for example, in U.S. Pat. Nos. 3,271,591; 5,543,737; 5,694,146; and 5,757,446; the disclosures of which are hereby incorporated by reference, as well as in several journal articles including "Reversible Electrical Switching Phenomena in Disordered Structures," Physical Review Letters, vol. 21, p. 1450-1453 (1969) by S. R. Ovshinsky; "Amorphous Semiconductors for Switching, Memory, and Imaging Applications," IEEE Transactions on Electron Devices, vol. ED-20, p. 91-105 (1973) by S. R. Ovshinsky and H. Fritzsche; which are hereby incorporated by reference. Three-terminal OTS devices are disclosed, for example, in U.S. Pat. Nos. 6,969,867 and 6,967,344; which are hereby incorporated by reference. Three-terminal OTS devices may be employed as an alternative to the 2 terminal OTS for uni or bi-directional read and/or write, as will be evident to one reasonably skilled in the art (For example, connection to a power supply with the on/off determined by the row line connected to the third terminal, where the power supply is connected to higher voltage for writing in one direction and to a more negative supply for writing in the opposite direction).

Alloys of elements of group VI of the periodic table, such as Te, S or Se, referred to as chalcogenides or chalcogenic materials, can be used advantageously in threshold switching devices.

A wide range of chalcogenide compositions has been investigated in an effort to optimize the performance characteristics of chalcogenic devices. Chalcogenide materials generally include a chalcogen element and one or more chemical or structural modifying elements. The chalcogen element (e.g. Te, Se, S) is selected from column VI of the periodic table and the modifying elements may be selected, for example, from column III (e.g. Ga, Al, In), column IV (e.g. Si, Ge, Sn), or column V (e.g. P, As, Sb) of the periodic table. The role of modifying elements includes providing points of branching or cross-linking between chains comprising the chalcogen element. Column IV modifiers can function as tetracoordinate modifiers that include two coordinate positions within a chalcogenide chain and two coordinate positions that permit branching or crosslinking away from the chalcogenide chain. Column III and V modifiers can function as tricoordinate modifiers that include two coordinate positions within a chalcogenide chain and one coordinate position that permits branching or crosslinking away from the chalcogenide chain. Embodiments in accordance with the principles of the present invention may include binary, ternary, quaternary, and higher order chalcogenide alloys. Examples of chalcogenide materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein. Chalcogenide materials may also be the resultant of a reactive sputtering process: a chalcogenide nitride, or oxide, for example and chalcogenide may be modified by an ion implantation or other process.

In the conceptual block diagram of FIG. 1, a bidirectional writing memory cell 100 in accordance with the principles of the present invention includes an OTS 102 connected in series with a bidirectional memory element 104. Use for unidirectional writing memory cell will be apparent to those reasonably skilled in the art. One or more OTS 102 is coupled at a first terminal 106 to a first supply SUPPLY1 and at a second terminal 108 to a first terminal 110 of the bidirectional memory element 104. Here bidirectional refers to the writing of the memory element; however, certain memories may also be read in either or both directions. The bidirectional memory element is coupled to a second supply SUPPLY2 through a second terminal 112.

In accordance with the principles of the present invention the supplies, SUPPLY1 and SUPPLY2, may be coupled to respective terminals of the memory cell 100 through and under control of circuitry, such as decoding circuitry, which will be described in greater detail in the discussion related to FIGS. 2 and 3. The supplies, SUPPLY1 and SUPPLY2 may be configured as current supplies or voltage supplies and may include both current and voltage supplies.

Additionally, in order to satisfy the demands of the bidirectional memory element 104, each of the supplies SUPPLY1 and SUPPLY2 are bidirectional. That is, each supply may be of a "positive" or "negative" voltage (polarities are a matter of convention) or each supply may source or sink current, for example. In different embodiments, the bidirectional aspect of the supplies may be implemented by switching various positive elements (e.g. corresponding to a positive voltage or sourcing a current) and negative elements (e.g. corresponding to a negative voltage or sinking a current) into or out of the supply circuit.

Figure 2:
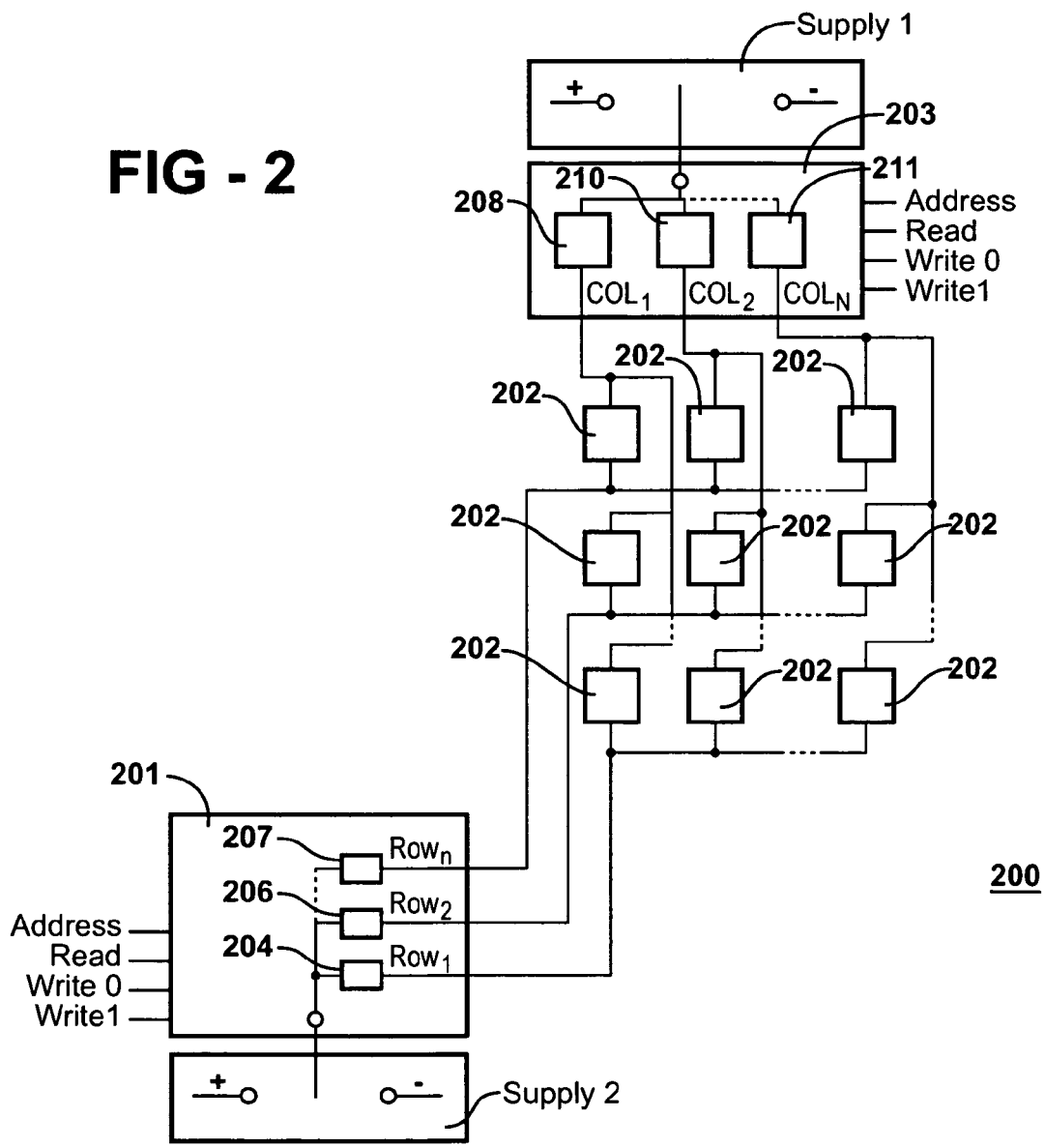
FIG. 2 is a conceptual block diagram of a bidirectional memory array in accordance with the principles of the present invention.

The conceptual block diagram of FIG. 2 provides an overview of a bidirectional array in accordance with the principles of the present invention. This array may be used as a memory array, in embedded memory circuits, or field programmable array, for example, using techniques known to those reasonably skilled in the art. The bidirectional memory array 200 includes a plurality of bidirectional memory cells 202 arranged in a crosspoint array. Each of the cells 202 includes a bidirectional memory element and OTS connected in series, as described in the discussion related to FIG. 1. Two supplies, Supply1 and Supply2, are configured to provide positive and negative voltage and/or current to selected cells 202 within the array 200. As will be described in greater detail in the description related to the discussion of FIG. 3, one or both of the supplies SUPPLY1 and SUPPLY2 may include components that are directed toward specific memory operations. For example, a supply may include specific current sources, set at different levels, for reading from and writing to memory cells. Selection circuits 201 and 203 operate to select among the different polarities of supply respectively provided by supplies Supply1 and Supply2.

In accordance with the principles of the present invention, during any given access operation (a READ operation, a WRITE 0 operation, or a WRITE 1 operation), the selection circuits 201 and 203 typically select supplies of opposite polarities. That is, during a WRITE 1 operation, for example, selection circuit 203 may select a positive supply while selection circuit 201 selects a negative supply in order to pass current through a memory cell in a direction appropriate for writing a logic "1" to a selected memory cell. During a WRITE 0 operation the selection circuit 203 may then select a negative supply while selection circuit 201 selects a positive supply, thereby providing for current flow through a selected memory cell in a direction opposite that required for a WRITE 1 operation. The selection circuits 201 and 203 base their selections on input signals including: ADDRESS, READ, WRITE 0 and WRITE 1 signals. In an illustrative embodiment selection circuits include bidirectional switches such as switches 204, 206, 208 and 210. The bidirectional switches 204, 206, 208 and 210 are used to select row and column lines that, in combination, select individual memory cells within the array 200. Bidirectional switches are employed to accommodate the bidirectional nature of the memory elements within the memory cells 202.

Figure 3:
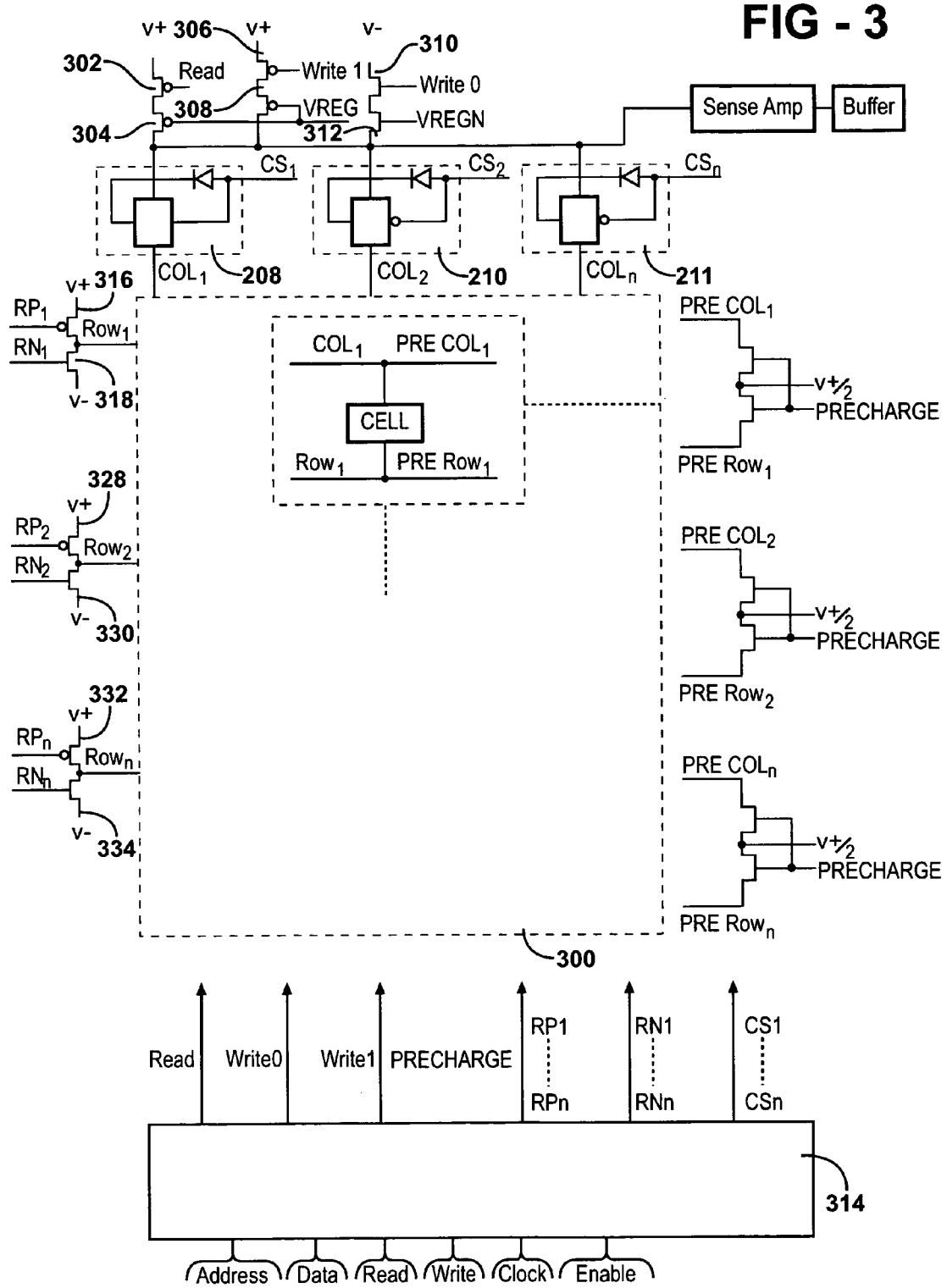
FIG. 3 is a more detailed block diagram of a bidirectional memory array in accordance with the principles of the present invention.

The schematic diagram of FIG. 3 provides a more detailed view of an illustrative embodiment of a bidirectional memory array in accordance with the principles of the present invention. In this illustrative embodiment a cross-point memory array 300 includes bidirectional memory cells selected by the assertion of respective row and column lines, as previously described (e.g., cell 2, 2 is selected by assertion of column 2 and row 2 lines). In this illustrative embodiment Supply1 includes READ, WRITE 1 and WRITE 0 circuitry. The READ circuit includes a pair of series-connected p-channel FETs 302 and 304 connected at the source of 302 to a positive supply voltage V+ and, through the drain of FET 304, to a common supply output that is selectively coupled to all the column lines feeding the array 300. In this illustrative embodiment, the gate of p-channel FET 304 is controlled by a regulated voltage signal, VREGP, produced by a bandgap regulator, which supplies a steady, temperature-compensated control voltage for the p-channel FET 304. The gate of the p-channel FET 302 is controlled by the READ signal. When the READ signal is brought low relative to the supply voltage V+, a low-resistance path is established between the drain of the p-channel FET 304 and the supply voltage V+. Whenever the READ signal turns the p-channel FET 302 on in this manner, current through the FET 304 is controlled by the voltage VREGP at the gate of the FET 304.

Similarly, the WRITE 1 circuit includes a pair of series-connected p-channel FETs 306 and 308 connected at one end to the positive supply voltage V+ and, through the drain of FET 308, at the other end to the common supply output that is selectively coupled to all the column lines feeding the array 300.

In this illustrative embodiment, the gate of p-channel FET 308 is controlled by a regulated voltage signal, VREGP, produced by a bandgap regulator, which supplies a steady, temperature-compensated control voltage for the p-channel FET 308. The gate of the p-channel FET 306 is controlled by the WRITE1 signal. When WRITE1 is brought low relative to the supply voltage V+, a low-resistance path is established between the drain of the p-channel FET 308 and the supply voltage V+. Whenever the WRITE1 signal turns the p-channel FET 306 on in this manner, current through the FET 308 is controlled by the voltage VREGP at the gate of the FET 308. Because the current requirements for READ and WRITE 1 operations may be different (for example, the current required to write a memory element to a low resistance state may be greater than that required to READ the same memory element), the p-channel FET 308 used to produce a WRITE pulse may be larger than the p-channel FET 304 used to produce a READ pulse, thereby providing greater current at the same, VREGP, gate voltage.

In this illustrative embodiment the WRITE0 operation is of opposite polarity from that of the READ and WRITE1 operations. That is, in this example, Read current polarity may be the same as the Write1. Then, in order to read the contents of one of the memory cells in the array 300 or to write a logic "1" into such a cell, current flows in one direction and to write a logic "0" into such a cell current flows in the opposite direction. In this embodiment the WRITE0 circuit includes a pair of series-connected n-channel FETs 310 and 312 connected at one end to the negative supply voltage V− through the source of FET 310, at the other end through the drain of FET 312 to the common supply node that is selectively coupled to a selected column line from the array 300, thus coupling reverse polarity current to a selected memory cell for writing 0.

The gate of n-channel FET 312 is controlled by a regulated voltage signal, VREGN, produced by a bandgap regulator, which supplies a steady, temperature-compensated control voltage for the n-channel FET 312. The gate of the n-channel FET 310 is controlled by the WRITE0 signal. When WRITE0 is brought high relative to the supply voltage V−, a low-resistance path is established between the source of the n-channel FET 312 and the supply voltage V−. Whenever the WRITE0 signal turns the n-channel FET 310 on in this manner, current amplitude through the FET 312 is controlled by the voltage VREGN applied to the gate of the FET 312.

As previously noted, in this illustrative embodiment, the outputs of the READ, WRITE1, and WRITE0 circuits may be tied to a common node of the column lines; or more than one set may drive one individually, or a subset, of the column lines (so more column lines are active in parallel, thus improving bandwidth). In addition to determining the function to be performed and the selection of supply sources carried out by the control signals READ, WRITE1 and WRITE0, each column line may have a control input that is governed by address decoding circuitry. That is, a column line is selected by decoding signals input sourced from decoders driven by the address lines. In the illustrative embodiment of FIG. 3 decoding circuitry 314 receives address lines ADDRESS and generates column selection control signals CS1, CS2, . . . , CSn, based on address signals presented on the address lines ADDRESS. The column select signals CS1, CS2, . . . , CSn control respective bidirectional switches BISW1, BISW2, . . . , BISWn that provide access to corresponding column lines. In this manner, READ, WRITE1, and WRITE0 signals determine the magnitude and polarity of an access signal and the address lines ADRESS determine which of the column lines will receive the access signal.

In this illustrative embodiment, the bidirectional switches BISW1, BISW2, . . . BISWn are implemented as CMOS analog switches. CMOS analog switches are known in the art. Because they employ both p-channel and n-channel FETs, CMOS analog switches can provide a relatively low-resistance signal path regardless of the polarity or voltage of a signal imposed across them. That is, when "ON," the p-channel and n-channel devices complement one another so that, as the resistance of the n-channel device increases due to a variation in the signal voltage across the device, that of the p-channel device decreases, and vice versa. With lower performance and more limited voltage range, a single n or p-channel device may be used instead of the illustrative p-channel and n-channel devices in parallel.

One or more sense amplifiers SENSEAMP may be coupled to the common node of the column lines. Under control of signals including READ and CLOCK signals, the sense amplifier SENSEAMP sense and condition the contents of an accessed memory cell during a read operation. Output from the sense amplifier SENSEAMP may be temporarily stored in a buffer BUFFER, for example. Other sense amplifier configurations are contemplated within the scope of the invention.

In this illustrative embodiment, each row line is connected to p-channel 316, 328, 332 and n-channel 318, 330, 334 FETs that respectively couple the row line to a positive or negative supply, depending upon whether the respective row is selected, and whether a READ, WRITE0, or WRITE1 operation is to be performed. With both the n-channel 330, 334 and p-channel 328, 332 FETs off, the respective row line may "float." In accordance with the principles of the present invention, the row lines may be pre-charged to a voltage, such as V+/2, for example. In this illustrative embodiment, the row and column lines are coupled through n-channel FETs to V+/2 under control of a signal PRECHARGE. Additionally, the row lines may be forced to an intermediate voltage, such as V+/2, whenever unselected.

In an illustrative embodiment, a further driver may be added to each row and column that forces it to V/2 when unselected. Such driver may be an N-FET with Drain to a voltage, such as V/2 (V++V−/2), and source to the row (or column). The gate is controlled from the decoder and is high whenever the row (or column) respectively is not selected.

In the illustrative embodiment, decoding circuitry 314 receives signals including: ADDRESS, DATA, READ, WRITE, CLOCK, and ENABLE. The decoding circuitry 314 employs these signals to develop control signals, including READ, WRITE0, WRITE1, PRECHARGE, RP1 . . . RPn, RN1 . . . RNn, and CS1 . . . CSn, which are distributed to the array and employed as previously described. That is, for example, signals RP1-n control the gates of p-channel FETs that, in combination with n-channel FETs controlled at their gates by signal RN1-n, develop the row select signals Row1-n. The signals CS1-n control analog pass-through mux switches that develop the column select signals COL1-n. The PRECHARGE signal controls series connected n-channel FETs that tie row and column lines to a pre-charge voltage (V/2 in this illustrative embodiment) through terminals PRECOL1-n and PREROW1-n.

The bidirectional nature of READ and WRITE operations in this illustrative embodiment may be better understood through use of an example. In this illustrative embodiment, when the decoder 314 interprets WRITE, ADDRESS, and DATA signals as an instruction to write a "1" into memory cell CELL 1,1 (that is, the memory cell uniquely addressed by the combination of asserting both row 1 and column 1), the WRITE 1 signal is asserted (WRITE 1 driven "low" relative to V+), CS1 is asserted (driven "low" relative to V+) to allow a pulse (referred to herein as a "positive" pulse, by convention) developed by WRITE1 to pass the appropriate write current from V+ to column line COL1. Additionally, the ROW1 signal is asserted (ROW1 is driven "low" to V− for a write 1 operation by driving both Rn1 and RP1 "high"). On the other hand, to write a "0" into memory cell CELL1,1 the WRITE 0 signal is asserted (WRITE 0 driven "high" relative to V−), CS1 is asserted (driven "low" relative to V+) to allow a negative pulse developed by WRITE0 to pass to column line COL1, and the ROW1 signal is asserted. That is, ROW1 is driven "high" to V+ for a write 0 operation by driving both Rn1 and RP1 "low".

The timing diagrams of FIGS. 4A-4D illustrate the process of accessing (that is, reading, writing a logic "1", and writing a logic "0") a bidirectional memory cell in accordance with the principles of the present invention. In this illustrative embodiment, the bidirectional nature of the memory cells is manifested in a requirement that a logic "1" be written using a positive current pulse (as previously noted, the terms "positive" and "negative" terms being a matter of convention), resulting in a relatively high resistance value and a logic "0" is written using a negative current pulse, resulting in a relatively low resistance value. A read operation also employs a positive current pulse, but may be a negative current pulse depending on the memory technology used with the OTS select device and its orientation within the cell relative to the example circuitry described herein.

As described in the discussion related to FIG. 3, and as indicated in the timing diagrams of FIGS. 4A-4D, when not accessing an associated memory cell, row and column select signals are maintained at an intermediate voltage (V/2 in this illustrative embodiment) to further ensure against inadvertent accesses of cells within the array 300. That is, when no cells on a given row, ROWn, are to be selected, the respective row decoded outputs RPn and RNn may both be "OFF" (as their respective p-channel 316 and n-channel 318 FETs will be) and the corresponding row line ROWn may be left at an intermediate value, such as V/2 by precharge circuitry, as described in greater detail in the description related to FIG. 3 (e.g., RPn, RNn, and CSn are OFF, allowing the row and column lines to be driven to V/2 by precharge circuitry that generates PRECOLn and PREROWn, such as during the pre-charge that terminates the cycle). Maintaining row and column lines at an intermediate voltage also limits the magnitude of voltage swings during operation, thereby allowing for faster, reduced-noise operation, and reduced current drain—thereby reducing power consumption and, in portable applications, increasing the time a device may be operated between charging. Additionally, with rows and columns at equal voltages, the leakage between (unselected) rows and columns is reduced, further improving battery life. In another illustrative embodiment, the unselected rows may be at V/3 (when writing 0) or 2V/3 (when reading or writing 1), thereby yielding an improvement in margin against false select.

Figure 4A:
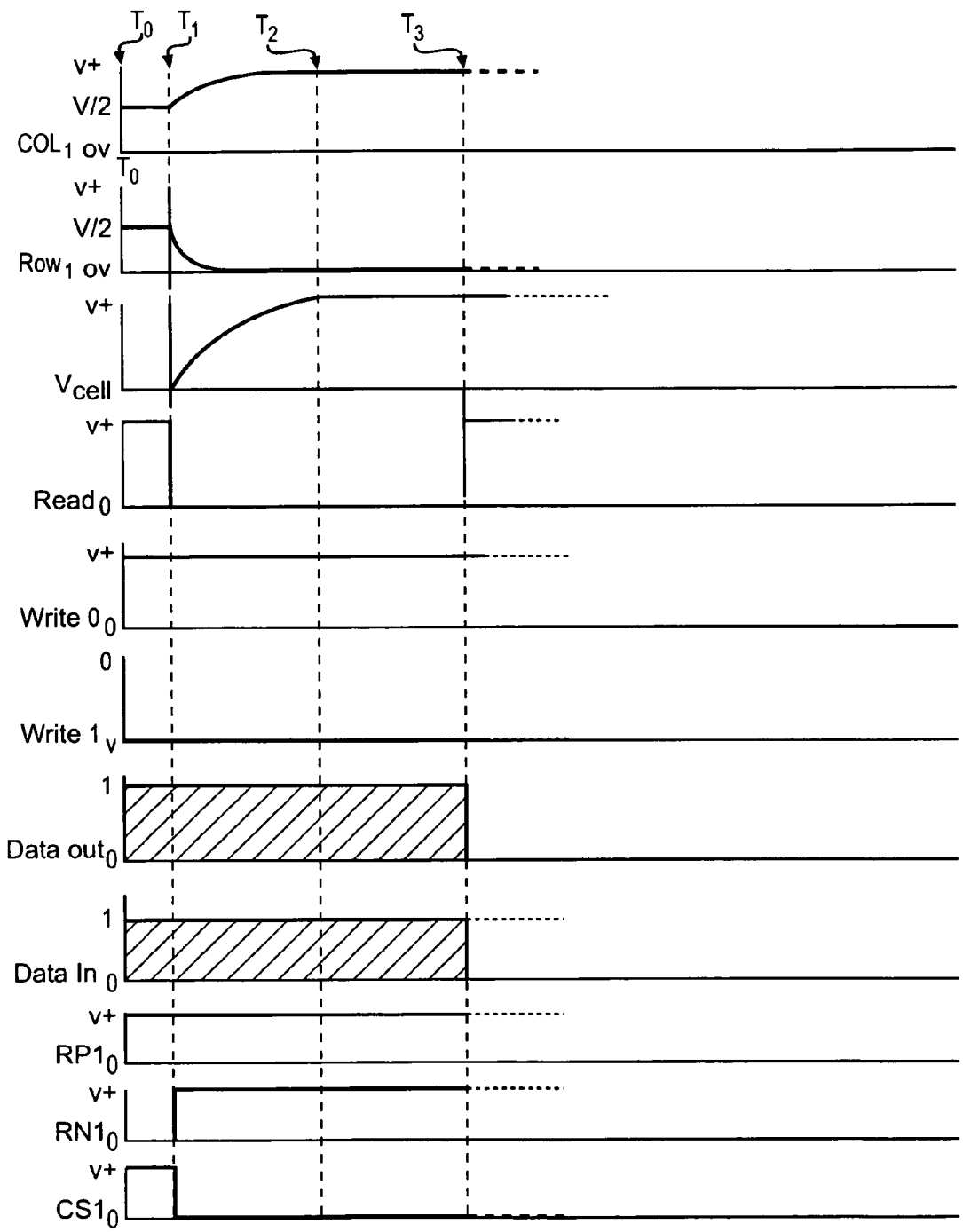
FIGS. 4A through 4D are timing diagrams of illustrative operations of bidirectional memories in accordance with the principles of the present invention.

The timing diagram of FIG. 4A depicts a read operation in accordance with the principles of the present invention in which the bidirectional memory cell being read (e.g., CELL 1,1) is in a high-resistance, logic "0," RESET state.

At time t0 both the row one select signal ROW1 and column one select signal COL1 are, as all row and column signals within the array 300 are, at the "precharge" voltage V/2. In this illustrative example, the read process is initiated by driving the column line COL1 associated with the memory cell CELL 1,1 high (towards V+ with a current source) and the row line ROW1 associated with the memory cell CELL 1,1 low (to 0V) at time t1. In this illustrative embodiment the column line COL1 is charged to a positive voltage by a current pulse generated by asserting the READ signal and analog switch control signal CS1 at time t0. That is, the memory cell CELL 1,1 within the array 300 is accessed at time t1 by asserting the row one and column one select signals, ROW1 and COL1, respectively.

As described in greater detail in the discussion related to FIG. 3, the read signal READ is, in this illustrative embodiment, asserted by driving the gate of p-channel FET 302 to a "low" voltage (0V in this illustrative example), thereby providing a positive pulse (the magnitude of which is regulated by VREGP) to the column access circuitry. The pulse that is thus-produced is gated—that is, allowed to pass (or blocked)—to the appropriate column by activating (or not activating) the corresponding bidirectional switch (e.g., switch 208). In this illustrative example, the bidirectional switch control signal CS1 is asserted by driving the signal to a "LOW" voltage V−.

The column select signal COL1 is therefore, in this illustrative embodiment, a current pulse (generated by activation of the READ p-channel FET 302) that is allowed to pass through bidirectional analog switch 208 to a column line that is connected to the column inputs of all memory cells in column 1 of the array 300. The row select signal ROW1 is generated, as described in greater detail in the discussion related to FIG. 3, by address decoding circuitry 314 that employs ADDRESS, READ, WRITE and DATA inputs to generate the row (RP1 and Rn1) control signals. Because, in this illustrative embodiment, the polar, or bidirectional, nature of the memory cells is manifested by the requirement of driving a current through the device in opposite directions to write a "1" or a "0," the decoded row outputs RPn and RNn generate row control signals ROWn that are configured to sink or source current, depending upon the type of access (READ, WRITE 0, or WRITE 1) operation that is to be performed.

At time T1, then, the row line ROW1 is driven low to V− (0V in this illustrative embodiment) by driving RN1 HIGH and thereby turning on n-channel FET RN1 (RP1 remains HIGH and p-channel FET 316 "OFF"); the column line COL1 is charged by a current pulse that is generated by driving the READ signal low (turning on p-channel FET 302) and turning on the bidirectional analog switch 208 by driving CS1 low. In this illustrative embodiment, the n-channel FETs employed to drive the row lines low (e.g., n-channel FET 318) are characterized by a low on resistance (Ron) and are therefore capable of rapidly driving the row lines to 0V. On the other hand, the column lines are charged by a current source with the amplitude determined by the gate voltage VREGP and, therefore, the column lines COLn are charged more gradually than the row lines ROWn are discharged, as indicated by the gradual upward and sharp downward curves, respectively, of FIG. 4A. In this illustrative embodiment, the size of the p-channel FET 304 is selected to ensure that, with the applied gate voltage VREGp, the current through it cannot disturb the memory state of any memory cells within the array 300 during a READ operation. As will be apparent to those skilled in the art, the read or write current source (with a voltage compliance) may be replaced by a voltage (with a current compliance or internal resistance), should the memory cell technology be better read (or written) with a voltage source.

The voltage Vcell across the memory cell CELL 1,1 is the difference between the column and row voltages. If, as in this example, the memory element is in a high resistance state, the voltage applied to the memory cell Vcell through the combination of "grounding" the row line ROW1 and the current-limited charging of the column line COL1 will be distributed across the series-connected OTS 102 and bidirectional memory element 104. To a first approximation, the distribution of the voltage will be proportional to the resistances of the OTS 102 and the memory element 104. If their resistances are equal, the voltage will be distributed equally; if, for example, one of the devices (OTS or memory element) exhibits one third the total series resistance, one third of the voltage will fall across it, etc. In this illustrative embodiment, with the memory in a high resistance state, the proportion of the peak read voltage (reached at time t2) that falls across the OTS is not enough to trigger the OTS. In accordance with the principles of the present invention, parameters such as the peak READ voltage, relative resistances of the memory element and OTS, and OTS threshold voltage are selected so that the OTS is triggered at t2 during a READ operation if the cell is in its low resistance state but the OTS is not triggered during a READ operation if the cell is in its high resistance state (for example, ⅔ (peak READ) is greater than or equal to the threshold voltage of the OTS but a lesser amount, ½ (peak READ) is less than the threshold voltage of the OTS). When the OTS is triggered, the voltage on the column falls to an even lower voltage, with the memory in a low resistance state (with less voltage across the OTS). If the snapback of the OTS is excessive for a required Vth needed for the memory, the snapback may be reduced while retaining the higher Vth by using one or more OTS in series (each with a lower Vth), such as by stacking thinner OTS in series. Adjustments of threshold and snapback voltages. are discussed, for example, in U.S. Pat. No. 7,280,390, which is hereby incorporated by reference.

At time t3, the read output is latched. A delay between t2 and t3 provides time for the output sense amplifiers to be accessed and for the voltage at a selected cell's column to settle (for example, if the memory element is in a low resistance state, the OTS has time to trigger and pull the column line down to a level that will be recognized as a low resistance state (i.e., a "SET" or logic "1" state). In this illustrative embodiment, the positive-going edge of the READ signal may be used to latch data that is valid at this time (t3). As illustrated by the trace labeled DATA OUT, output data is undefined until t3 (cross-hatching) at which point DATA OUT is valid (a logic "0" in this illustrative embodiment) and the rising edge of the READ signal latches the valid output. In this illustrative embodiment input DATA IN is undefined, as indicated by the cross-hatching, and may be on a signal line separate from DATA OUT.

Figure 4B:
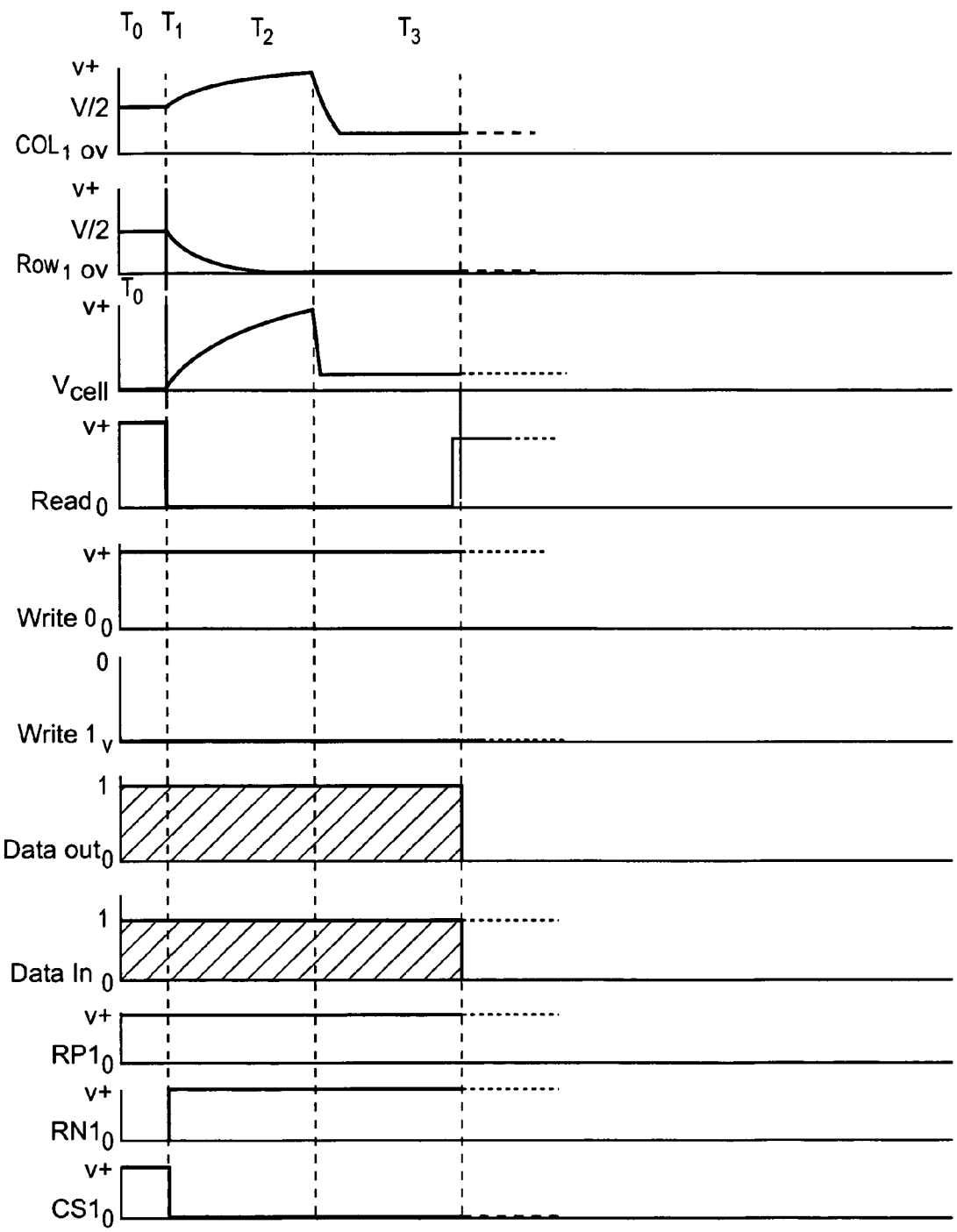

The timing diagram of FIG. 4B depicts a read operation in accordance with the principles of the present invention in which the bidirectional memory cell being read (CELL 1,1) is in a low-resistance, logic "1," SET state.

At time t0 both the row one select signal ROW1 and column one select signal COL1 are, as all row and column signals within the array 300 are, at the "precharge" voltage V/2. As described in greater detail above, at time t1 the row line ROW1 is driven to 0V by driving RN1 HIGH and thereby turning on n-channel FET RN1 (RP1 remains HIGH and p-channel FET 316 "OFF"); the column line COL1 is charged by a current pulse that is generated by driving the READ signal low (turning on p-channel FET 302) and turning on the bidirectional analog switch 208 by driving CS1 low. With the applied gate voltage VREGP, the current through the p-channel FET 304 is adjusted to avoid disturbing the memory state of the selected memory cell within the array 300 during a READ operation; if necessary assisted by turning off the pulse and stopping the read cycle before excessive voltage or current flows in the memory cell but after adequate signal develops to reliably read the memory.

The voltage Vcell across the memory cell CELL 1,1 is the difference between the column and row voltages. The voltage applied to the memory cell Vcell through the combination of "grounding" the row line ROW1 and the current-limited charging of the column line COL1 will be distributed across the series-connected OTS 102 and bidirectional memory element 104. The distribution of the voltage is proportional to the resistances of the OTS 102 and the memory element 104. In this illustrative embodiment the memory element 104 exhibits a low resistance and the majority of the voltage Vcell falls across the OTS 102. At time t2, the voltage across the OTS 102 reaches the threshold voltage of the OTS 102 and the OTS triggers (that is, enters a low resistance state) in response. Because both the OTS 102 and memory element 104 are now in a low resistance state, the voltage Vcell across the memory cell falls, as indicated in the Vcell trace of FIG. 4B.

In this illustrative embodiment, the on resistance of the p-channel FET supplying current to the column line COL1 is greater than the on resistance of the n-channel FET discharging the row line ROW1 and, consequently, the column line voltage COL1 falls, while the row line voltage remains substantially at 0V. The voltage across the memory cell Vcell falls, approximately, to the sum of the OTS holding voltage (Vh), about 1V, and the product of the memory cell's resistance and current through it, as indicated by the trace labeled Vcell in FIG. 4B. This lower voltage may be sensed at time t3 and properly interpreted as a low resistance, "SET", "1" state. As previously described, design parameters may be tuned so that the OTS triggers when the memory element is in a low resistance state but does not trigger when the memory element is in a high resistance state. In the alternative, the OTS may be triggered for either memory state, with the voltage for a higher resistance memory being proportionately higher. At time t3, the read output is latched, as described in greater detail in the discussion related to FIG. 4A.

Figure 4C:
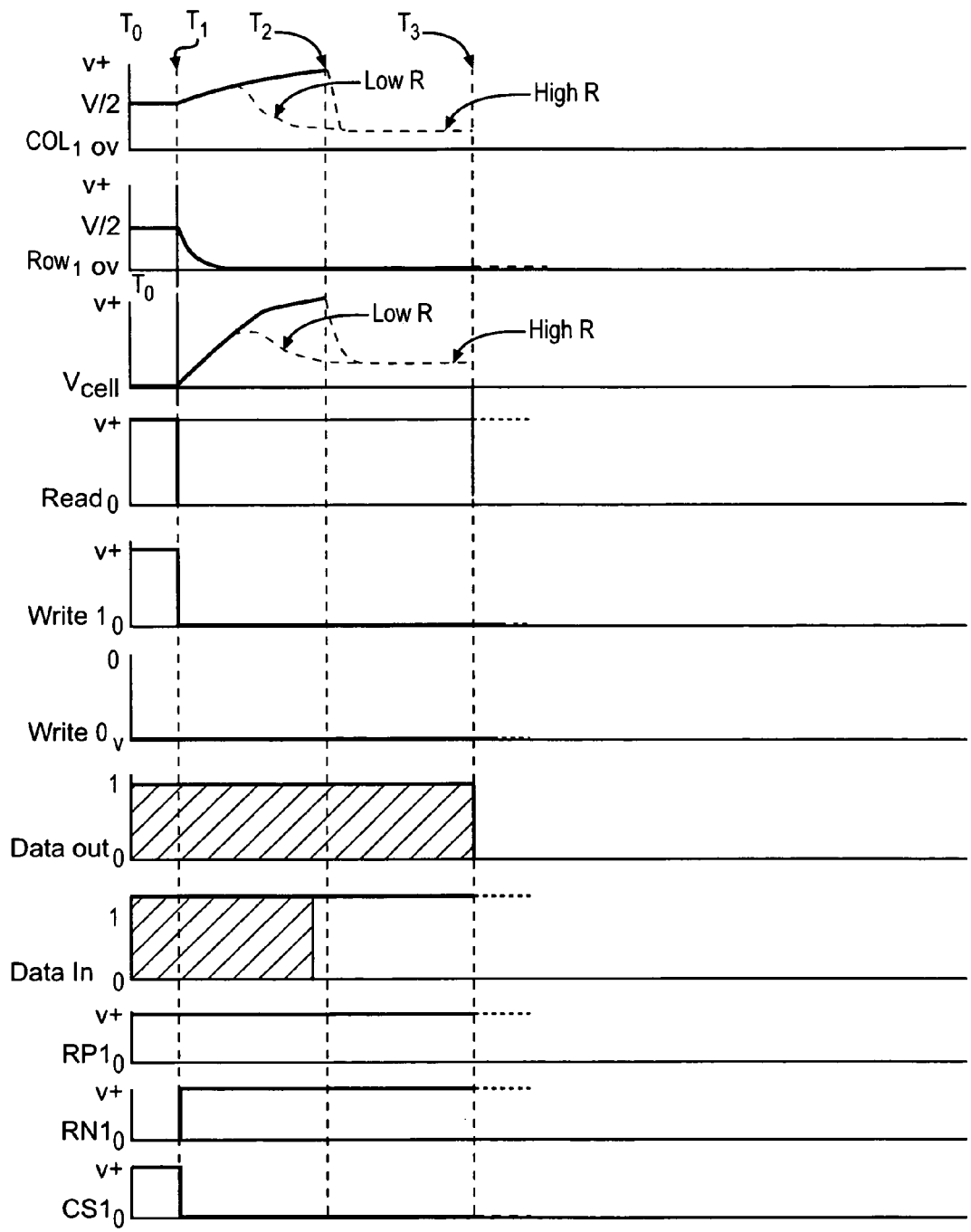

The timing diagram of FIG. 4C depicts the sequence of a write "1" (low resistance) "SET" operation in accordance with the principles of the present invention. In this illustrative embodiment, programming a memory cell to a low resistance state (that is, writing a logic "1" into the memory), is accomplished by forcing a current through the memory cell in the same direction as the previously described read current is forced through a cell. As previously described, the pulse generation circuitry used to program a cell to a low resistance state may, for example, use more current than is used to read such a cell.

At time t0 both the row one select signal ROW1 and column one select signal COL1 are at the "precharge" voltage V/2. In the alternative, a V/3 approach could be used to improve write margin. In this illustrative example, the WRITE 1 process is initiated at time t1 by driving the column line COL1 associated with the memory cell CELL 1,1 high (towards V+) and the row line ROW1 associated with the memory cell CELL 1,1 low (to 0V). In this illustrative embodiment the column line COL1 is charged to a positive voltage by a current pulse generated by asserting the WRITE 1 signal and analog switch control signal CS1 at time t1.

As indicated in the trace labeled COL1, the column line of the selected memory cell CELL 1,1 begins to charge to a more positive voltage than V/2. At the same time, the row line, represented by the trace labeled ROW1 is rapidly discharged from V/2 to 0V. The memory cell voltage represented by the trace labeled Vcell is the difference between the column and row voltages.

If the memory element 104 is already in a low resistance state, the majority of the cell voltage Vcell will fall across the OTS 102. As a result, the OTS will trigger at a relatively low cell voltage, as indicated by the broken-line traces labeled LowR in the COL1 and Vcell plots. If, on the other hand, the memory element 104 is in a high resistance state, the cell voltage Vcell will be distributed across the series combination of the OTS 102 and memory element 104 according to their relative resistances and the OTS 102 will trigger at a higher cell voltage, as indicated by the broken-line traces labeled high-R in the COL1 and Vcell traces. In both cases, that is, where the existing state of the memory cell is low resistance and where the existing state of the memory cell is high resistance, the OTS 102 is triggered and sufficient current is delivered to the memory element 104 to program it to the logic "1" low resistance state after the OTS triggers.

Figure 4D:
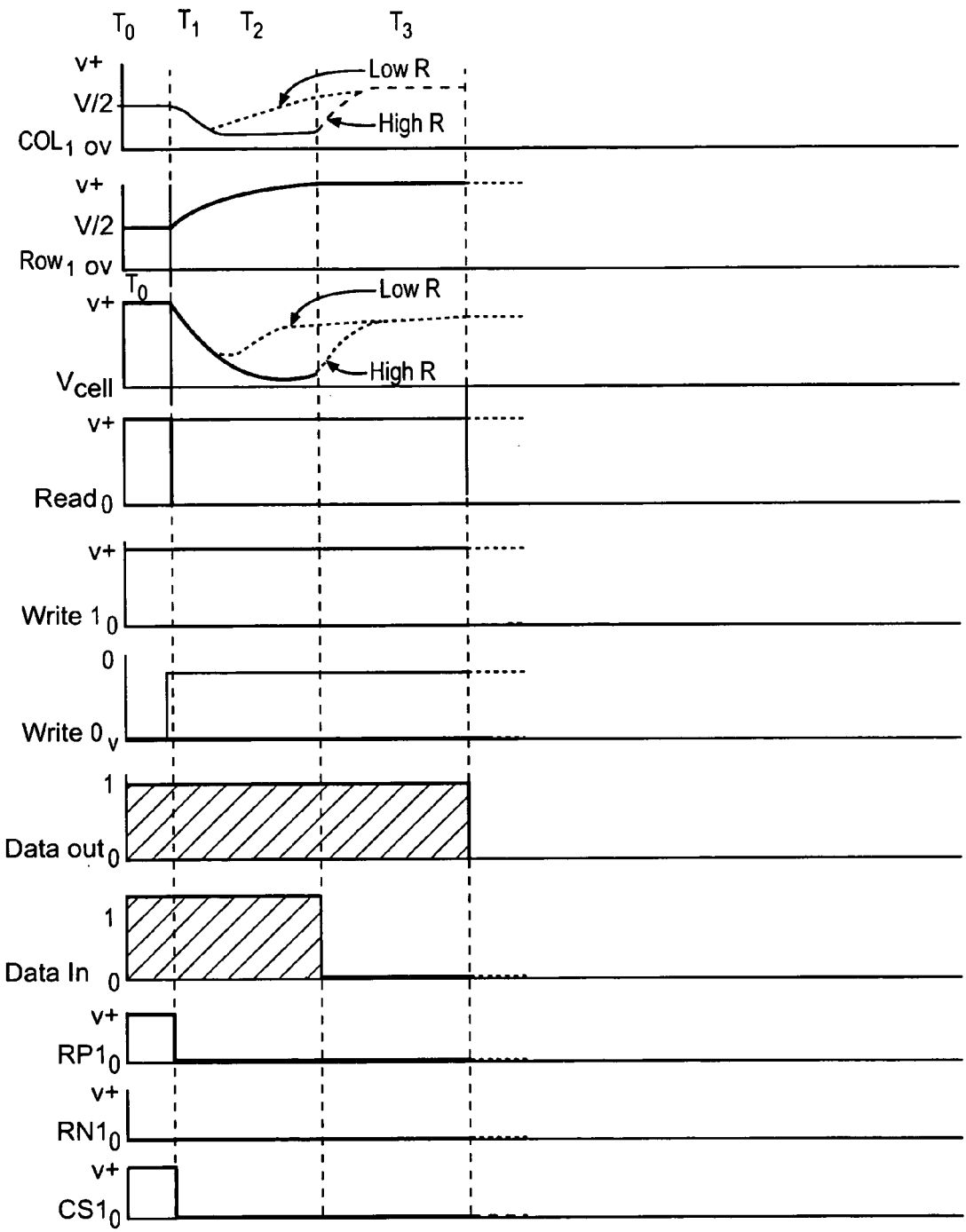

The timing diagram of FIG. 4D depicts the sequence of a write "0" (high resistance) "RESET" operation in accordance with the principles of the present invention. In this illustrative embodiment, programming a memory cell to a high resistance state (that is, writing a logic "0" into the memory), is accomplished by forcing a current through the memory cell in the opposite direction as the previously described write "1" current is forced through a cell.

At time t0 both the row one select signal ROW1 and column one select signal COL1 are at the "precharge" voltage V/2. In this illustrative example, the WRITE 0 process is initiated at time t1 by driving the column line COL1 associated with the memory cell CELL 1,1 low (towards V−, such as 0V) and the row line ROW1 associated with the memory cell CELL 1,1 high (to V+). This biasing scheme produces a current through the memory element 104 in the opposite direction from that employed in either a READ or WRITE 1 operation. In this illustrative embodiment the column line COL1 is discharged from V/2 to 0V by a current pulse generated by asserting the WRITE 0 signal and analog switch control signal CS1 at time t1. Current is supplied through the memory element 104 from the V+ supply through p-channel transistor 316 by assertion (driving low) the signal RP1 at time t1. The signal RN1 remains "low" and, consequently, the n-channel FET 318 remains "off."

As indicated in the trace labeled COL1, the column line of the selected memory cell CELL 1,1 begins to discharge from V/2 toward 0V. At the same time, the row line, represented by the trace labeled ROW1 is rapidly charged from V/2 toward V+. The memory cell voltage represented by the trace labeled Vcell is the difference between the column and row voltages. If the memory element 104 is already in a low resistance state, the majority of the cell voltage Vcell will fall across the OTS 102. As a result, the OTS will trigger at a relatively low cell voltage, as indicated by the broken-line traces labeled LowR in the COL1 and Vcell plots. If, on the other hand, the memory element 104 is in a high resistance state, the cell voltage Vcell will be distributed, as previously described, across the series combination of the OTS 102 and memory element 104 according to their relative resistances and the OTS 102 will trigger at a higher cell voltage, as indicated by the broken-line traces labeled high-R in the COL1 and Vcell traces. In both cases, that is, where the existing state of the memory cell is low resistance and where the existing state of the memory cell is high resistance, the OTS 102 is triggered and sufficient current is delivered to the memory element 104 to program it to the logic "0" high resistance state after the OTS triggers.

As previously discussed, various parameters, such as the magnitude of the OTS trigger voltage, may be adjusted to suit the requirements of a specific memory technology. For example, the read and write voltages associated with ionic memory cells are relatively low-level, typically less than 1V. OTS devices used as isolation devices in an array of such ionic memory cells may be tailored to trigger at 2V, for example.

Figure 5:
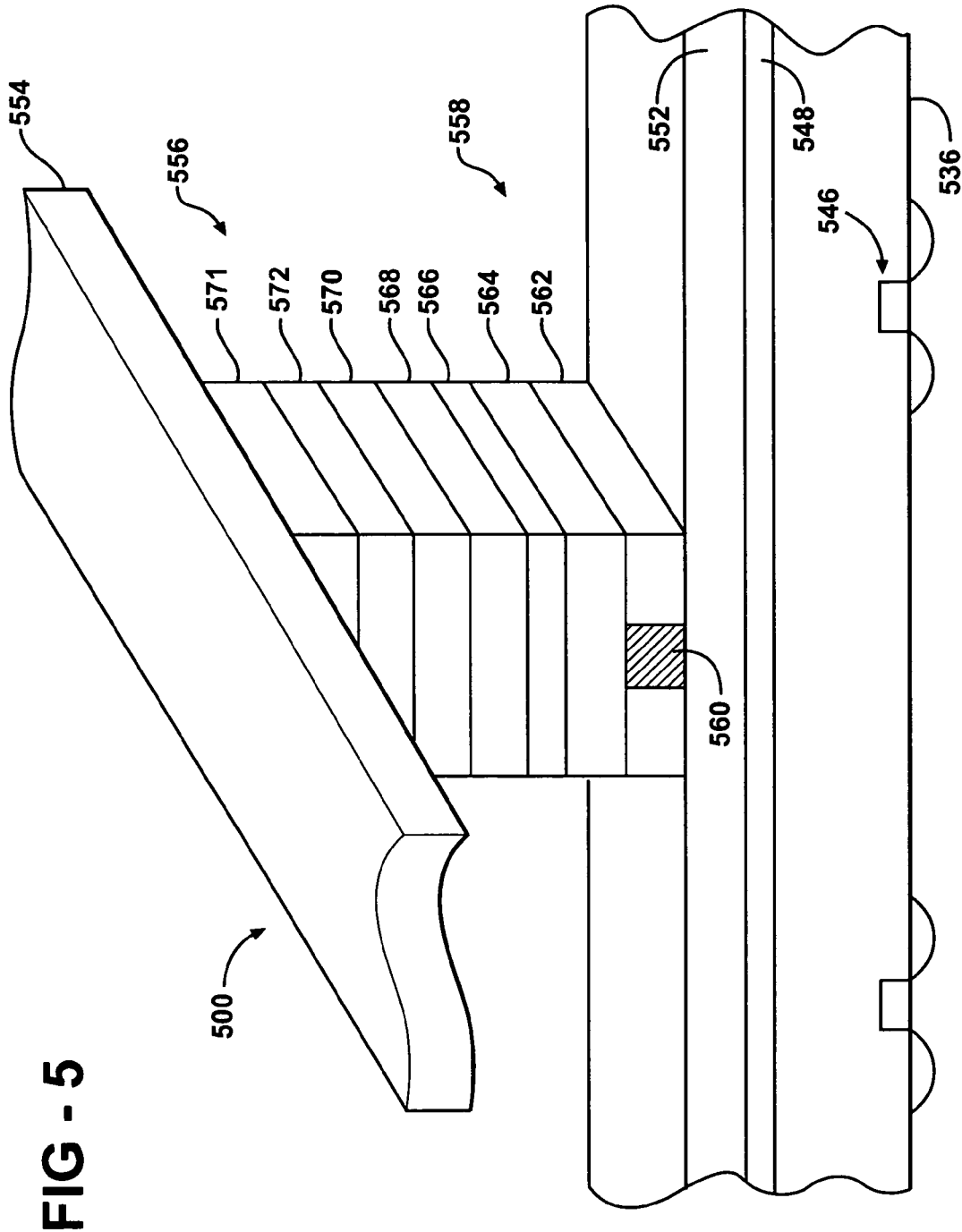
FIG. 5 is a perspective view of an illustrative bidirectional memory cell in accordance with the principles of the present invention.

Referring to FIG. 5, a cell 500 may be formed over a substrate 536 with a conductive word line 552 coupled to the device 556 and the element 558. An interlayer dielectric 548 may separate the integrated circuit components 546 from the bidirectional memory 550. The components 546 may include any of a variety of components, such as logic gates, a microprocessor, or memory, for example.

In this illustrative embodiment, the selection device 556 is an OTS formed of a non-programmable chalcogenide material. The OTS includes a top electrode 571, a chalcogenide material 572, and a bottom electrode 570. The selection device 556 may be permanently in the amorphous state in one embodiment. While an embodiment is illustrated in which the selection device 556 is positioned over the bidirectional memory element 558, the opposite orientation may be used as well. Typical OTS with symmetrical electrodes have relatively symmetrical characteristics. These may be adjusted, for example, by changing the electrodes. For better endurance, a tungsten electrode may be used for one or both, as a heat sink.

As previously noted, the bidirectional memory element 558 may be capable of assuming either a set or reset state. The bidirectional memory element 558 may include an insulator 562, a bidirectional memory material 564, a top electrode 566, and a barrier film 568, in one embodiment of the present invention. A lower electrode 560 may be defined within the insulator 562 in one embodiment of the present invention.

The bidirectional material 564 may be a bidirectional material suitable for non-volatile memory data storage characterized by two states. As previously described, the material may be programmed to one state by application of a voltage or current in one direction and to the other state by a current or voltage applied in the opposite direction. The memory may be read by application of similar voltage or current signal, or one of lesser magnitude, for example, in the same direction as one of the write signals.

Programming of the memory material to alter the state of the material may be accomplished by applying voltage potentials to the lines 552 and 554, thereby generating a voltage potential across the memory material 564. An electrical current may flow through a portion of the memory material 564 in response to the applied voltage potentials.

In an illustrative embodiment, a voltage potential difference of about 0.5 to 1.5 volts may be applied across a portion of the memory material by applying about 0 volts to a line 552 and supply about 0.5 to 3.0 volts to an upper line 554. A current flowing through the memory material 564 in response to the applied voltage potentials may be used to read or alter the state of the material.

The information stored in memory material 564 may be read, for example, by measuring the resistance of the memory material. As an example, a read current may be provided to the memory material using opposed lines 554, 552 and a resulting read voltage across the memory material may be compared against a reference voltage using, for example, a sense amplifier. The read voltage may be proportional to the resistance exhibited by the memory storage element.

In order to select the cell 550 defined by the intersection of column 554 and row 552, the OTS 556 for the selected cell 550 may be triggered in order to provide bidirectional access. When activated, the selection device 556 allows current to flow through the memory element 558 in a direction determined by the bias applied across the cell 550 and may effect a READ, WRITE 0, or WRITE 1 operation.

When a low voltage is applied across the OTS device 556, the OTS device 556 is off and may exhibit very high resistance in some embodiments. This is true regardless of the direction of the applied field. The off resistance can, for example, range from $10^5$ ohms to greater than $10^9$ ohms at a bias of half the threshold voltage. OTS device characteristics, such as threshold voltages, may be tailored to individual applications by adjustment of composition of the chalcogenide material 572, adjustment of the thickness of the chalcogenide layer 572, or "stacking" of OTS devices, for example.

The OTS device 556 may remain in its off state until a threshold voltage $V_{TH}$ or threshold current $I_T$ switches the OTS device 556 to a highly conductive, low resistance on state. In an illustrative embodiment, the voltage across the device 556 after turn-on drops to a lower voltage or dynamic resistance, called the holding voltage $V_H$ and remains there so long as sufficient current, $I_H$, is supplied to the device. The difference between the threshold voltage $V_{TH}$ and holding voltage $V_H$ is commonly referred to as the "snapback" voltage, and the corresponding region of a current/voltage plot is referred to as the snapback region. With low Vth, snapback may be zero.

In operation, an access signal applied to a memory cell 500 in accordance with the principles of the present invention does not instantaneously transform the cell voltage. That is, on the time scale of a memory access operation, the access signal gradually charges the cell 500 and the associated row and column lines, toward a target access voltage. During the charging process a portion of the voltage across the cell 500 increases across the OTS device 556. As the voltage applied to the cell 500 increases, the voltage across the OTS device 556 reaches the threshold voltage of the OTS device 556, at which point the OTS device 556 triggers and becomes highly conductive, snapping back to Vh with a low dynamic resistance, such as less than 1000 ohms (depending on choice and resistance of electrodes).

To a first approximation, during this charging process, the proportion of cell voltage that falls across the OTS 556 is determined by the ratio of the resistance of the OTS 556 in the "off" state to that of the memory element 558, which may change for each with changing voltage across each. As previously noted, the "OFF" resistance of the OTS 556 may range up to $10^9$ ohms or more and, as a result, analyses often assume that, so long as the OTS 556 remains in the off state, the majority of the voltage applied to the cell 500 falls across the OTS 556, with only an insignificant portion of the cell voltage being imposed across the memory element 558.

Additionally, analyses often assume that, to a first approximation, once the OTS device 556 triggers, the voltage across the OTS device 556 remains substantially at the device's holding voltage $V_H$ and that the remainder of the cell voltage (Vcell–VH) falls across the memory element 558. As previously described, a minimal current $I_H$ must be maintained through the OTS in order for the voltage across the OTS device 556 to fall to and remain at the holding voltage $V_H$. Should the current through the OTS 556 be limited (for example, by the resistance of the memory element 558) to a value less than the holding current $I_H$, the OTS device 556 will remain in the "OFF" state, with a voltage drop greater than Vh and less than $V_{TH}$, rather than about equal to $V_H$.

Consequently, if the memory element 558 is in a high resistance state and, in that high resistance state, exhibits a resistance that would limit current through the series connection of the OTS 556 and memory element 558 to less than the holding current $I_{TH}$ of the OTS device 556, the OTS device 556 will remain OFF and the voltage across the OTS device 556 will remain at or less than the device's threshold voltage $V_{THOTS}$. The voltage across the memory device will be the difference between the cell voltage and the OTS voltage: $V_{cell} - V_{ots}$ On the other hand, if the memory device is in its high resistance state but the resistance it exhibits in that high resistance state is low enough to permit the threshold current $I_{TH}$ to flow and voltage across the OTS exceeds Vth, the OTS 556 will turn on and the voltage across the OTS 556 will fall to the device's holding voltage, approximately $V_H$, or more accurately: Vh+I×dv/di (Vh+the current through the device times the dynamic resistance when in the triggered state). The remainder of the cell voltage will fall across the memory element 558.

Similarly, if the memory element 558 is its low resistance state but that low resistance state exhibits a resistance that would limit current through the series connection of the OTS 556 and memory element 558 to less than the threshold current $I_{th}$ of the OTS device 556, the OTS device 556 will remain OFF and the voltage across the OTS device 556 will remain less than or at the OTS device's threshold voltage $V_{THOTS}$. The voltage across the memory device will be the difference between the cell voltage and the OTS voltage: $V_{cell} - V_{THOTS}$. If the memory device is in its low resistance state and the resistance it exhibits in that low resistance state is low enough to permit the threshold current $I_{TH}$ to flow, the OTS 556 will turn on and the voltage across the OTS 556 will fall to the device's holding voltage $V_H$, and the remainder of the cell voltage will fall across the memory element 558. The OTS will remain on unless the current through the device falls below its holding current, Ih.

In the case where an OTS device 556 exhibits snapback (that is, $V_{TH} > V_H$) and the resistance of the memory element 558 is not so great as to prevent the OTS device 556 from thresholding, after passing through the snapback region, in the on state, the OTS device 556 voltage drop remains close to the holding voltage as the current passing through the device is increased up to a relatively high current level. Above the threshold current level, the device triggers on and so long as more than the holding current flows, the device remains on and displays a relatively low, finite differential resistance with the voltage drop increasing with increasing current, and at an intercept zero current projected at the holding voltage, Vh. The OTS device 556 may remain on until the current through the OTS device 556 is dropped below a characteristic holding current value that is dependent on the size and the material utilized to form the OTS device 556.

In some embodiments of the present invention, the OTS device 556 does not change phase. It remains permanently amorphous and its current-voltage characteristics may remain the same general shape and characteristics throughout its operating life. As an example; for a 0.5 micrometer diameter device 556 formed of TeAsGeSSe having respective atomic percents of 16/13/15/1/55, the holding current may be on the order of 0.1 to 100 micro-amps in one embodiment. Below this holding current, the device 556 turns off and returns to the high resistance regime at low voltage, low field. The threshold current for the device 556 may generally be of the same order as the holding current. The holding current may be altered by changing process variables, such as the top and bottom electrode material and the chalcogenide material. The device 556 may provide high "on current density" for a given area of device compared to conventional access devices such as metal oxide semiconductor field effect transistors or bipolar junction transistors.

In some embodiments, the higher current density of the OTS device 556 in the "on" state allows for higher programming current available to the memory element 558. Where the memory element 558 is a bidirectional memory, this enables the use of larger programming current bidirectional memory devices, reducing the need for dedicating more of the chip area to the arrayed cell area with the potential for considerable cost savings and improved memory performance.

One technique for addressing the bidirectional memory array uses a voltage V applied to the selected column and a zero voltage applied to the selected row. For the case where the element 558 is a bidirectional memory, the voltage V is chosen to be greater than the access device 556 maximum threshold voltage plus the memory element 558 reset maximum threshold voltage, but less than two times the device 556 minimum threshold voltage. In other words, the maximum threshold voltage of all the device 556 plus the maximum reset threshold voltage of the element 558 within the array may be less than V to ensure that all cells can be selected and programmed. And V may be less than two times the minimum threshold voltage of the device 556 (plus the minimum memory cell element voltage during thresholding the OTS) in some embodiments to help assure against false select of deselected memory cells. As previously described, all of the unselected rows and columns may be biased at V/2. With this approach, there is no bias voltage between the unselected rows and unselected columns. This reduces background leakage current.

After biasing the array in this manner, the memory elements 558 may be programmed and read by whatever means is needed for the particular memory technology involved. A memory element 558 that uses a bidirectional material may be programmed by forcing the current needed for programming a bidirectional memory element or the memory array can be read by forcing a lower current to determine the element 558 resistance, for example.

A bidirectional memory array in accordance with the principles of the present invention may employ peripheral conductive lines to interconnect memory elements and use vias to connect conductive lines and line segments located on different layers of the bidirectional memory array. Additionally, such a memory array may employ "shared" address lines. Sharing of address lines and the use of peripheral interconnect lines is known in the art and disclosed, for example, in a published United States patent application entitled "Shared Address Lines For Crosspoint Memory," application Ser. No. 11/202,428, publication number 2006/0120136 which is hereby incorporated by reference.

Bidirectional memory arrays in accordance with the principles of the present invention may also be stacked in layers atop one another. Such stacking of memory devices is known in the art and disclosed, for example, in U.S. Pat. No. 6,795, 338, entitled "Memory Having Access Devices Using Phase Change Material Such As Chalcogenide," which is hereby incorporated by reference.

The bidirectional memory devices described in the discussion related to the previous figures may be employed to particular advantage in a wide variety of systems. The schematic diagram of FIG. 6 will be employed to illustrate the devices' use in a few such systems. The schematic diagram of FIG. 6 includes many components and devices, some of which will be used for specific embodiments of a system in accordance with the principles of the present invention and others not. In other embodiments, other similar systems, components and devices may be employed. In general, the system includes logic circuitry configured to operate along with memory. The logic circuitry may be discrete, programmable, application-specific, or in the form of a microprocessor, for example. And the embodiments herein may also be employed within the chips or connected to such circuitry.

Figure 6:
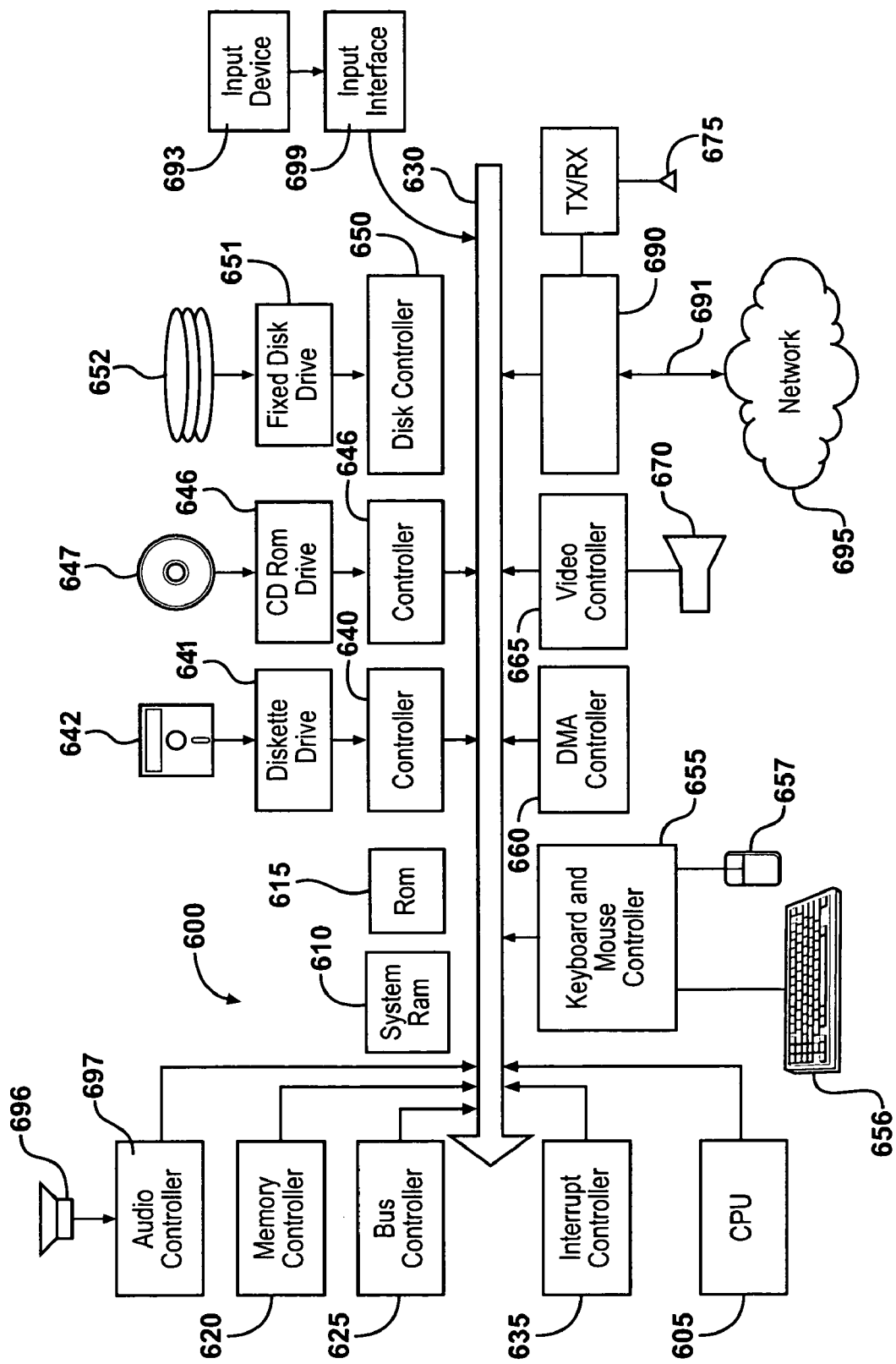
FIG. 6 is a conceptual block diagram of an electronic system that includes a bidirectional memory array in accordance with the principles of the present invention.

The exemplary system of FIG. 6 is for descriptive purposes only. Although the description may refer to terms commonly used in describing particular computer, communications, tracking, and entertainment systems, the description and concepts equally apply to other systems, including systems having architectures dissimilar to that illustrated in FIG. 6. The electronic system 600, in various embodiments, may be implemented as, for example, a general purpose computer, a router, a large-scale data storage system, a portable computer, a personal digital assistant, a cellular telephone, an electronic entertainment device, such as a music or video playback device or electronic game, a microprocessor, a microcontroller, or a radio frequency identification device. Any or all of the components depicted in FIG. 6 may employ a memory with a bi-directional chalcogenide electronic device select switch, such as a chalcogenide-based threshold switch, for example.

In an illustrative embodiment, the system 600 may include a central processing unit (CPU) 605, which may be implemented with some or all of a microprocessor, a random access memory (RAM) 610 for temporary storage of information, and a read only memory (ROM) 615 for permanent storage of information. A memory controller 620 is provided for controlling RAM 610. In accordance with the principles of the present invention, all of, or any portion of, any of the memory elements (e.g. RAM or ROM) may be implemented as memory using a OTS in series with a bi-directional memory.

An electronic system 600 in accordance with the principles of the present invention may be a microprocessor that operates as a CPU 605, in combination with a memory that operates as RAM 610 and/or ROM615, or as a portion thereof. In this illustrative example, the microprocessor/chalcogenide select switch combination may be standalone, or may operate with other components, such as those of FIG. 6 yet-to-be described.

In implementations within the scope of the invention, a bus 630 interconnects the components of the system 600. A bus controller 625 is provided for controlling bus 630. An interrupt controller 635 may or may not be used for receiving and processing various interrupt signals from the system components. Such components as the bus 630, bus controller 625, and interrupt controller 635 may be employed in a large-scale implementation of a system in accordance with the principles of the present invention, such as that of a standalone computer, a router, a portable computer, or a data storage system, for example.

Mass storage may be provided by diskette 642, CD ROM 647, or hard drive 652. Data and software may be exchanged with the system 600 via removable media such as diskette 642 and CD ROM 647. Diskette 642 is insertable into diskette drive 641 which is, in turn, connected to bus 630 by a controller 640. Similarly, CD ROM 647 is insertable into CD ROM drive 646 which is, in turn, connected to bus 630 by controller 645. Hard disc 652 is part of a fixed disc drive 651 which is connected to bus 630 by controller 650. Although conventional terms for storage devices (e.g., diskette) are being employed in this description of a system in accordance with the principles of the present invention, any or all of the storage devices may be implemented using OTs as a select device in series with a bi-directional memory in accordance with the principles of the present invention. Removable storage may be provided by a nonvolatile storage component, such as a thumb drive, that employs an OTS with bi-directional memory in accordance with the principles of the present invention as the storage medium. Storage systems that employ such memory as "plug and play" substitutes for conventional removable memory, such as disks or CD ROMs or thumb drives, for example, may emulate existing controllers to provide a transparent interface for controllers such as controllers 640, 645, and 650, for example.

User input to the system 600 may be provided by any of a number of devices. For example, a keyboard 656 and mouse 657 are connected to bus 630 by controller 655. An audio transducer 696, which may act as both a microphone and a speaker, is connected to bus 630 by audio controller 697, as illustrated. Other input devices, such as a pen and/or tabloid may be connected to bus 630 and an appropriate controller and software, as required, for use as input devices. DMA controller 660 is provided for performing direct memory access to RAM 610, which, as previously described, may be implemented in whole or part using said memory devices in accordance with the principles of the present invention. A visual display is generated by video controller 665 which controls display 670. The display 670 may be of any size or technology appropriate for a given application.

In a cellular telephone or portable entertainment system embodiment, for example, the display 670 may include one or more relatively small (e.g. on the order of a few inches per side) LCD displays. In a large-scale data storage system, the display may implemented as large-scale multi-screen, liquid crystal displays (LCDs), or organic light emitting diodes (OLEDs), including quantum dot OLEDs, for example.

The system 600 may also include a communications adaptor 690 which allows the system to be interconnected to a local area network (LAN) or a wide area network (WAN), schematically illustrated by bus 691 and network 695. An input interface 699 operates in conjunction with an input device 693 to permit a user to send information, whether command and control, data, or other types of information, to the system 600. The input device and interface may be any of a number of common interface devices, such as a joystick, a touch-pad, a touch-screen, a speech-recognition device, or other known input device. In some embodiments of a system in accordance with the principles of the present invention, the adapter 690 may operate with transceiver 673 and antenna 675 to provide wireless communications, for example, in cellular telephone, RFID, and wifi computer implementations.

Operation of system 600 is generally controlled and coordinated by operating system software. The operating system controls allocation of system resources and performs tasks such as processing scheduling, memory management, networking, and I/O services, among things. In particular, an operating system resident in system memory and running on CPU 605 coordinates the operation of the other elements of the system 600.

In illustrative handheld electronic device embodiments of a system 600 in accordance with the principles of the present invention, such as a cellular telephone, a personal digital assistance, a digital organizer, a laptop computer, a handheld information device, a handheld entertainment device such as a device that plays music and/or video, small-scale input devices, such as keypads, function keys and soft keys, such as are known in the art, may be substituted for the controller 655, keyboard 656 and mouse 657, for example. Embodiments with a transmitter, recording capability, etc., may also include a microphone input (not shown).

In an illustrative RFID transponder implementation of a system 600 in accordance with the principles of the present invention, the antenna 675 may be configured to intercept an interrogation signal from a base station at a frequency $F_1$. The intercepted interrogation signal would then be conducted to a tuning circuit (not shown) that accepts signal $F_1$ and rejects all others. The signal then passes to the transceiver 673 where the modulations of the carrier $F_1$ comprising the interrogation signal are detected, amplified and shaped in known fashion. The detected interrogation signal then passes to a decoder and logic circuit which may be implemented as discrete logic in a low power application, for example, or as a microprocessor/memory combination as previously described. The interrogation signal modulations may define a code to either read data out from or write data into an OTS selected memory in accordance with the principles of the present invention. In this illustrative embodiment, data read out from the memory is transferred to the transceiver 673 as an "answerback" signal on the antenna 675 at a second carrier frequency $F_2$. In passive RFID systems power is derived from the interrogating signal and memory in accordance with the principles of the present invention is particularly well suited to such use.

I claim:
1. A bidirectional memory cell, comprising:
    a bidirectional selection device directly connected to a first address line; and
    a bidirectional memory element coupled to a second address line, the bidirectional selection device configured to block inadvertent access to the bidirectional memory element, the bidirectional memory element comprising a phase change memory cell; and
    a first supply configured to provide a first polarity to the first address line; and
    a second supply configured to provide a second polarity to the first address line, said second polarity being opposite said first polarity.
2. The memory cell of claim 1, wherein the bidirectional selection device comprises a three terminal OTS device.

3. The memory cell of claim 1, further comprising:
a microprocessor configured to initiate access of the bidirectional memory cell.

4. The memory cell of claim 3, further comprising a transceiver configured to transmit data from and receive data for the bidirectional memory.

5. The memory cell of claim 4, wherein the memory, microprocessor and transmitter/receiver are configured as a cellular telephone.

6. The memory cell of claim 4, wherein the memory, and microprocessor are configured as a handheld entertainment device.

7. The memory cell of claim 1, wherein the bidirectional selection device comprises a bidirectional threshold switch.

8. The memory cell of claim 7, wherein the bidirectional selection device comprises an ovonic threshold switch.

9. A bidirectional memory cell, comprising:
a bidirectional selection device directly connected to a first address line; and
a bidirectional memory element coupled to a second address line, the bidirectional selection device configured to block inadvertent access to the bidirectional memory element, the bidirectional memory element comprising a pnictide phase change memory; and
a first supply configured to provide a first polarity to the first address line; and
a second supply configured to provide a second polarity to the first address line, said second polarity being opposite said first polarity.

10. The memory cell of claim 9, wherein the bidirectional selection device comprises an ovonic threshold switch.

11. A bidirectional memory cell, comprising:
a bidirectional selection device directly connected to a first address line; and
a bidirectional memory element coupled to a second address line, the bidirectional selection device configured to block inadvertent access to the bidirectional memory element, the bidirectional memory element comprising a phase change memory cell; and
a first supply configured to provide a first polarity to the first address line; and
a second supply configured to provide a second polarity to the first address line, said second polarity being opposite said first polarity.

12. The memory cell of claim 11, wherein the bidirectional selection device comprises an ovonic threshold switch.

13. A bidirectional memory cell, comprising:
a phase change memory element coupled to a first address line;
an ovonic threshold switch directly connected to a second address line, the ovonic threshold switch configured to block inadvertent access to the phase change memory element;
a first supply configured to provide a first polarity to the second address line; and
a second supply configured to provide a second polarity to the second address line, said second polarity being opposite said first polarity.

14. The bidirectional memory cell of claim 13, wherein the resistive random access memory element has a first memory state obtained by programming with a signal from said first supply and a second memory state obtained by programming with a signal from said second supply.

15. The bidirectional memory cell of claim 13, wherein the bidirectional memory cell further comprises a second ovonic threshold switch, said second ovonic threshold switch being coupled in series with said first ovonic threshold switch, said second ovonic threshold switch further being coupled between said first address line and said second address line.

16. A bidirectional memory cell, comprising:
a bidirectional phase change memory element coupled to a first address line;
an ovonic threshold switch directly connected to a second address line, the ovonic threshold switch configured to block inadvertent access to the bidirectional memory element;
a first supply configured to provide a first polarity to the second address line; and
a second supply configured to provide a second polarity to the second address line, said second polarity being opposite said first polarity.

17. The bidirectional memory cell of claim 16, wherein said bidirectional memory element comprises a resistive random access memory element.

18. The bidirectional memory cell of claim 16, wherein said bidirectional memory cell further comprises a second ovonic threshold switch, said second ovonic threshold switch being coupled in series with said first ovonic threshold switch, said second ovonic threshold switch further being coupled between said first address line and said second address line.

* * * * *